United States Patent [19]

Clark

[11] Patent Number: 5,319,682

[45] Date of Patent: Jun. 7, 1994

[54] ADAPTIVE DATA COMPRESSION SYSTEM

[75] Inventor: Alan D. Clark, Bromham, United Kingdom

[73] Assignee: Cray Communications Limited, Berkshire, United Kingdom

[21] Appl. No.: 802,255

[22] Filed: Dec. 9, 1991

[30] Foreign Application Priority Data

Dec. 8, 1990 [GB] United Kingdom ............... 9026733

[51] Int. Cl.⁵ ..................... H04B 1/66; H04L 23/00
[52] U.S. Cl. ................................ 375/122; 375/121
[58] Field of Search .................. 375/121, 122, 25, 27; 381/34, 35, 29; 358/133; 341/143, 51; 307/269; 328/153

[56] References Cited

U.S. PATENT DOCUMENTS

| | | | |
|---|---|---|---|
| 4,560,977 | 6/1983 | Murakami et al. | 341/118 |
| 5,086,439 | 2/1992 | Asai et al. | 375/122 |
| 5,172,228 | 12/1992 | Israelson | 358/133 |

Primary Examiner—Stephen Chin
Assistant Examiner—Tesfaldet Bocure
Attorney, Agent, or Firm—Young & Thompson

[57] ABSTRACT

An adaptive data compression system comprises an encoder 2 which responds to input characters by producing output codewords according to a stored encoding map or table of characters and codewords, and an adapter 4, 5 which adapts the encoding map or table in accordance with the input characters so as to increase the compression ratio between the input characters and output codewords. An optimizer 5 monitors the performance of the system and accordingly varies adaptation of the encoding map or table by the adapter 4 so as to optimize performance of the system. Performance of the system is preferably monitored in terms of the computational loading of the processor and the compression ratio it achieves. A decoder 7 subsequently decodes the codewords by reference to a corresponding decoding map or table which is adapted 9, 10 in accordance with the output data from the decoder and in accordance with variations in the adaptation process in the encoder.

11 Claims, 2 Drawing Sheets

ADAPTIVE DATA COMPRESSION SYSTEM

TECHNICAL FIELD

This invention relates to an adaptive data compression system suitable for use in a communications system.

Data compression systems improve the performance of communication or storage systems by removing some of the redundancy present in the data being processed. Known data compression systems involve the use of codes or codewords to represent a string of data characters, for example, Huffman codes and Ziv-Lempel codes are commonly used. It is also known to improve the performance of such data compression systems by adapting the codewords used according to the data being processed, this preferably being done continuously after each data character received so as to adapt the codewords rapidly to accommodate new character sequences. However, a disadvantage of such adaptive data compression systems is the extra computational requirement of the system to generate and update the codewords used. Often this requirement may occupy a large part of the computational capacity of the processor and this is likely to increase with more powerful compression techniques. In extreme cases, the processing required may be greater than that available, in which case the capacity of the processor to encode data and generate corresponding codewords may be impaired resulting in a reduction of the data flow rate. This problem can be overcome by providing a processor with increased computational capacity, but this serves to increase the cost of the system.

DISCLOSURE OF THE INVENTION

An object of the present invention is to provide an adaptive data compression system in which the above problem is reduced or overcome.

This is achieved according to the invention by providing an adaptive data compression system comprising an encoder which responds to input characters by producing output codewords according to a stored encoding map or table of characters and codewords, and adapting means which adapts the encoding map or table in accordance with the input characters so as to increase the compression ratio between the input characters and output codewords, characterised in that optimisation means monitors the performance of the system and accordingly varies adaptation of the encoding map or table by the adapting means so as to optimise performance of the system.

Performance of the system is preferably monitored in terms of the computational loading of the processor of the system and the compression ratio it achieves, the compression ratio corresponding to the effectiveness of the encoding map or table in compressing the data. If the processor is heavily loaded or the compression ratio is high (corresponding to a near-optimal state of the encoding map or table), the rate of adaptation of the encoding map or table is reduced to leave more computational capacity for the encoding process. The compression ratio of the data may thereby be reduced, but this is more than offset by avoiding the greater reduction in data flow rate that would occur if the encoder had insufficient capacity to perform the basic encoding process.

It will be appreciated that an adaptive data compression system according to the invention is used in conjunction with a decoder which subsequently decodes the codewords by reference to a corresponding decoding map or table to produce an output corresponding to the original stream of input data to the encoder. The decoding map or table is adapted in accordance with the output data from the decoder and in accordance with variations in the adaptation process in the encoder so that its mapping corresponds to that of the encoding map or table. In a two-way data flow system, an encoder and decoder are provided at each end of a communications link and separate encoding and decoding maps or tables are employed in each direction. Thus pairs of encoder/decoders work in combination and the adaptation process is synchronised end-to-end.

DESCRIPTION OF THE DRAWINGS

The invention will now be described by way of example with reference to the accompanying drawings in which.

MODE OF CARRYING OUT THE INVENTION

Figure 1:
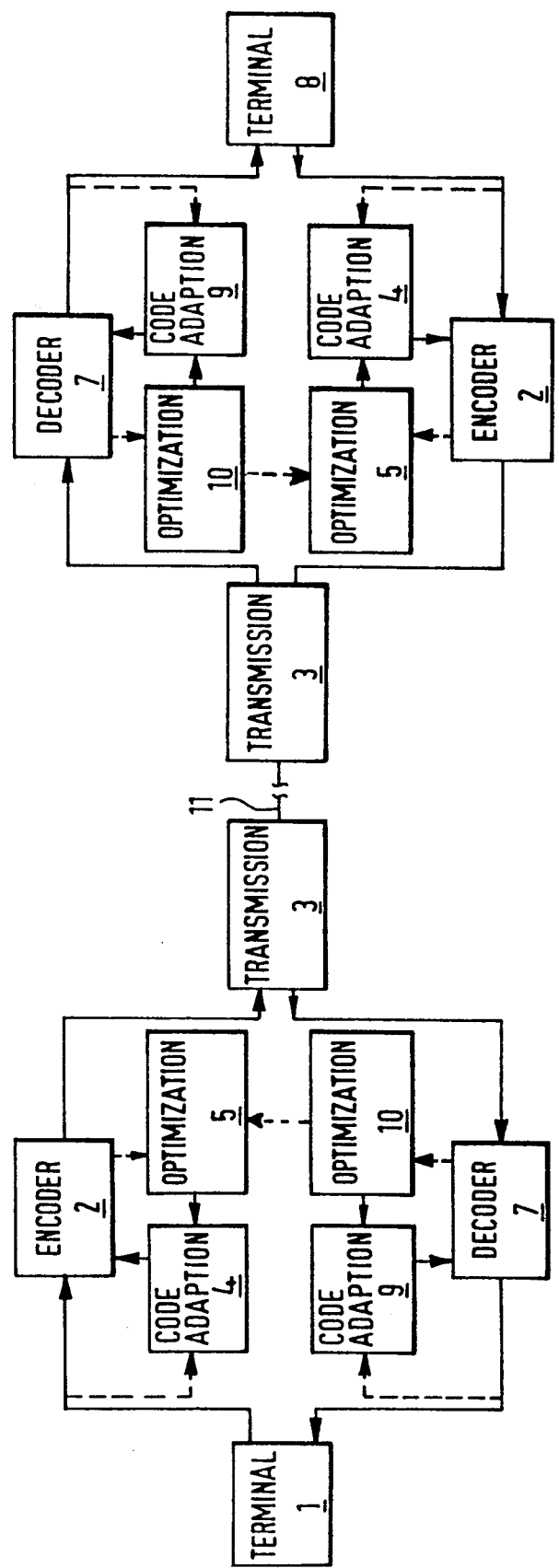
FIG. 1 is a schematic drawing showing an adaptive data compression system according to the invention.

A block diagram of an implementation of a data compression system according to the invention is shown in FIG. 1.

In the illustrated data compression system, a pair of terminals 1 and 8 are adapted to transmit and receive data between one another via a transmission line 11, and each terminal has associated with it a corresponding encoder 2 and a corresponding decoder 7. The terminals 1 and 8 may be simple data terminals, data communications equipment or computers. When either terminal 1 or 8 transmits data to the other the characters in the data are mapped into codewords by the encoder 2 according to a preselected compression algorithm. These codewords are then sent via a transmission function 3 and the communications link 11 to the other terminal, which also has a similar transmission function 3 which enables it to receive the codewords and pass these on to its decoder 7. The decoder 7 then recovers the original characters and passes these on to the receiving terminal. It will be appreciated that this data transmission process can work in both directions between the terminals 1 and 8, with either acting as a transmitter making use of its encoder 2, and the other then acting as a receiver making use of its decoder 7.

A code adaptation function 4 is associated with each encoder 2, and observes the incoming stream of characters from the terminal 1 or 8 and modifies the mapping of characters to codewords which occurs within the encoder 2. This mapping of characters to codewords is stored in a code table, commonly called a codebook or dictionary depending on the compression algorithm being used.

Figure 2:
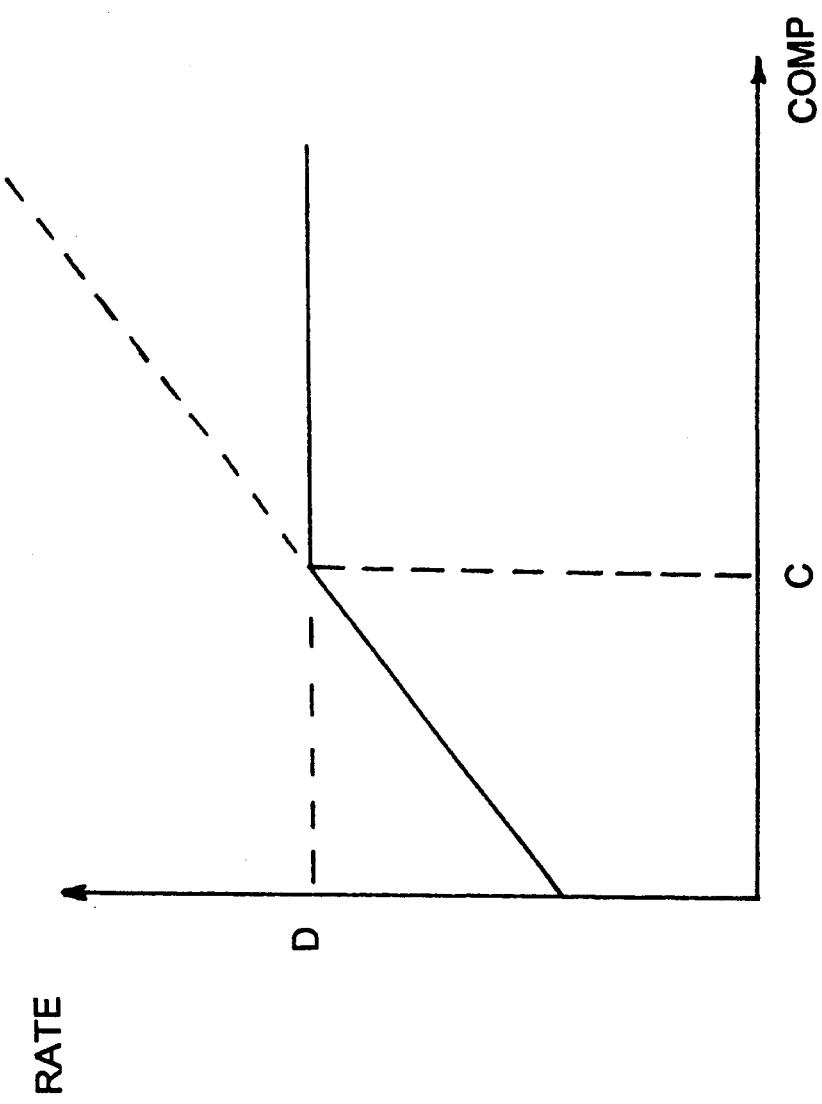
FIG. 2 is a graph of data compression ratio (COMP) against effective data throughput (RATE) of a data compression system.

In known data compression systems of this type, the computational load of the encoder 2 in adapting the mapping of characters to codewords may be so great that the data flow rate has to be limited to keep within the computational capacity of the system processor, thereby causing the system to operate sub-optimally, as shown in FIG. 2. That is, in FIG. 2, above the compression ratio C, the data flow rate is limited to a level D because of a lack of processor capacity which is dominated by the computational requirements of the encoder 2. In order to overcome this problem, the invention involves controlling the mapping process so that it is carried out in a non-optimal manner when it is required to reduce the computational loading of the processor, thereby producing an overall improvement in system performance which is closer to the theoretical optimum performance shown by the broken line in FIG. 2.

A system optimisation function 5 associated with each encoder 2 monitors the compression ratio and the loading of the processor. When the system optimisation function 5 detects that the efficiency of the data compression system is sub-optimal due to excessive computational load, it reduces the code adaptation rate. If at some later time, the system optimisation function 5 detects that the efficiency of the system is limited by the current compression ratio, rather than the computational load, then it increases the code adaptation rate.

Each decoder 7 has associated with it a code adaptation function 9 which observes the output of characters from the decoder, and modifies the mapping of codewords to characters which occurs within the decoder, this mapping being stored in a code table which is the equivalent of the mapping of characters to codewords in the encoders 2. A system optimization function 10 is associated with each code adaption function 9, and serves to adjust the code adaption rate of the latter under the control of the system optimization function 5 of the encoder 2 at the other end of the transmission line 11.

When the code adaptation rate is modified by the system optimisation function 5 of either encoder 2, the latter informs the system optimisation function 10 of the decoder 7 at the other end of the transmission line 11, which accordingly reduces the code adaptation rate of the associated code adaptation function 9. The communication of a change in rate may be by means of a reserved codeword as used in the system being described, or by a separate communications channel, or by an independent decision on the part of the receiving system.

The system optimisation function 5 is able to assess the current compression ratio being achieved by the encoder 2 by comparing the amount of data entering with that leaving the encoder in processing any particular sequence of input characters. The system optimization function is also able to measure the data rate at the input and output of the encoder 2 and obtain a ratio of input to output data rates which should be substantially equal to the compression ratio unless the encoder is operating suboptimally as a result of the processing capacity of the system being fully loaded.

The system optimization function 5 is also able to measure the data rate in each direction of transmission by counting the number of characters processed during a specific time interval.

The total processing capacity of the system in terms of characters per unit interval is a system parameter known to the system optimisation function 5 and may be configured by the system designer or system user or may be obtained from measurements of system performance. The system optimisation function 5 is therefore able to estimate the system loading by comparing the measured data rate with the total processing capacity. If the measured data rate approaches the total processing capacity, the system is assumed to be approaching a fully loaded state.

In an alternative embodiment of the invention, the system processor executes an idling process when not performing the compression task and the system optimisation function 5 may measure the amount of time spent in the idling process and from that estimate the current processor loading. If the amount of time spent in the idling process approaches zero, the system is assumed to be approaching the fully loaded state.

In a further embodiment of the invention, the number of characters awaiting processing in an input buffer may be counted and if the number increases or exceeds a threshold level the system optimisation function 5 may deduce that the processor is overloaded.

In a preferred embodiment of the invention, the compression method used is the Ziv-Lempel algorithm which requires that a new string of characters be added to the code table after the completion of the string matching process. When the system optimisation function 5 determines that the system is approaching or in a fully loaded state and therefore that some loss in performance is likely to occur, it reduces the code adaptation rate by permitting the code adaptation function 4 to add a new string to the code table every N string matching cycles, where N may be increased to a value at which the system loading is reduced. Preferably the value of N would initially be 4 which would result in the code table being updated one fourth as often as in the normal case, and if the system appeared still to be in the fully loaded state, the value of N would be increased to 16.

In an alternative embodiment of the invention, the compression method used is an adaptive Huffman algorithm or a derivative thereof which requires that a table of character frequencies be updated and a code tree adjusted after each matched character. When the system optimisation function 5 determines that the system is approaching or in a fully loaded state and therefore that some loss in performance is likely to occur, it reduces the code adaptation rate by permitting the code adaptation function 4 to update the table of character frequencies and adjust the code tree every M characters, where M may be increased to a value at which the system loading is reduced. Preferably the value of M would initially be 4 which would result in the code table being updated one fourth as often as in the normal case, and if the system appeared still to be in the fully loaded state, the value of M would be increased to 16.

Following a reduction in the code adaptation rate, the system optimisation function 5 observes the compression ratio and processor loading. If the processor loading falls to some predetermined level, for example 75 percent of full loading, or the compression ratio falls by some predetermined amount, for example to 90 percent of the compression ratio measured at the time when the code adaptation rate is reduced, then the code adaptation rate may be increased by reducing the value of N or M respectively or by setting their value to 1. The reduction in processor loading may occur for many reasons and it is generally advantageous to adapt the code at the highest rate possible commensurate with avoiding the fully loaded state. The reduction in compression ratio may occur because the data is changing and the current code is inefficient in which case it is again advantageous to increase the code adaptation rate.

such an improved data compression system offers the ability to improve the compression performance obtained from a low cost processor or to increase the complexity and sophistication of compression schemes whilst still using conventional processors. The reduction in system performance experienced with many known data compression systems due to processor loading is very evident, and the improvements described are therefore significant. The invention is applicable to most adaptive data compression systems, and the embodiment described provides only an example of such an improved system.

Although the embodiment described herein refers to improvements made to the encoder 2 within a system, it will be appreciated that the equivalent improvements must also be made to the decoder 7.

In a system which transfers data in two directions simultaneously, the processor loading problem may occur at either or both ends of the communications link. In the preferred embodiment, the encoder system optimisation function 5 at either end may detect the overload condition and act in the manner described above, and further the decoder system optimisation function 10 at the other end of the transmission line 11 may signal the encoder system optimisation function 5 at that end so that it also acts in the manner described above. By this means, the result of the system at either end detecting an overload condition is that the reduction in code adaptation rate is applied in both directions of transmission. In an alternative embodiment, the reduction in code adaptation rate may occur in only one direction.

We claim:

1. An adaptive data compression system comprising an encoder which converts input characters into output codewords according to a stored encoding map or table of characters and codewords stored in the encoder, adapting means which adapts the encoding map or table in accordance with the input characters so as to increase the compression ratio between the input characters and output codewords, and optimization means which monitors the computational loading of the system when converting input characters into output codewords and varies the rate at which the adapting means adapts the encoding map or table in accordance with said computational loading.

2. A system as claimed in claim 1 in which the optimisation means varies the rate at which the adapting means adapts the encoding map or table, either to reduce said rate to reduce computational loading of the system, or to increase said rate to improve the compression ratio of the system.

3. A system as claimed in claim 2 in which the optimisation means increases the rate at which the adapting means adapts the encoding map or table if the compression ratio falls below a predetermined maximum compression ratio.

4. A system as claimed in claim 1 in which the optimisation means monitors the computational loading by comparing the character processing rate of the encoder with a predetermined maximum rate.

5. A system as claimed in claim 1 in which the optimisation means monitors the computational loading by monitoring the time spent by the system when not processing input characters to compress them.

6. A system as claimed in claim 1 in which the optimisation means monitors the computational loading by monitoring the compression ratio of the encoder.

7. A system as claimed in claim 6, in which the optimization means monitors the computational loading by monitoring the ratio of the rate of input data to the encoder to the rate of output data from the encoder and comparing this ratio with said compression ratio.

8. A system as claimed in claim 1 which includes a decoder which converts to input codewords as received from the encoder into output characters according to a stored decoding map or table of codewords and characters, and adapting means which adapts the decoding map or table in accordance with the output characters and in accordance with variations in the adaptation process in the encoder so that its mapping corresponds to that of the encoding map or table.

9. A system as claimed in claim 8 in which the optimisation means causes the adapting means to adapt the decoding map or table in accordance with the variation in the adaptation process in the encoder.

10. A system as claimed in claim 9 in which an encoder and decoder are provided at each end of a two-way communications link, and each encoder is provided with corresponding adapting means which adapts the encoding map or table and optimisation means which varies the adaptation of the encoding map or table, and each decoder is provided with corresponding adapting means which adapts the decoding map or table and optimisation means which varies adaptation of the decoding map or table under the control of the optimisation means at the other end of the link so that the corresponding encoding and decoding maps or tables are adapted in step with one another, the optimisation means which varies adaptation of the decoding map or table also serving to control the optimisation means at the same end of the link which varies adaptation of the encoding map or table so that the encoding maps or tables of the adapting means at both ends of the link are adapted in step with one another.

11. A decoder for use with an adaptive data compression system as claimed in claim 1, the decoder being such as to convert to input codewords as received from the encoder into output characters according to a stored decoding map or table of codewords and characters, and comprising adapting means which adapts the decoding map or table in accordance with the output characters and in accordance with variations in the adaptation process in the encoder so that its mapping corresponds to that of the encoding map or table therein.

* * * * *